United States Patent [19]

Fujita et al.

[11] Patent Number: 4,847,516
[45] Date of Patent: Jul. 11, 1989

[54] SYSTEM FOR FEEDING CLOCK SIGNALS

[75] Inventors: Bunichi Fujita; Seiichi Kawashima, both of Kanagawa, Japan

[73] Assignee: Hitachi, Ltd., Tokyo, Japan

[21] Appl. No.: 123,939

[22] Filed: Nov. 23, 1987

[30] Foreign Application Priority Data

Nov. 26, 1986 [JP] Japan .................. 61-279602

[51] Int. Cl.⁴ .......................... H03K 5/15; H03L 7/00
[52] U.S. Cl. ..................... 307/269; 328/55; 328/62; 328/63; 328/105; 331/2
[58] Field of Search .................. 307/269; 328/60, 20, 328/155, 63, 72, 55, 103, 105, 70, 71, 133; 331/2

[56] References Cited

U.S. PATENT DOCUMENTS

| | | | |
|---|---|---|---|
| 3,725,793 | 4/1973 | Phillips | 328/63 |
| 3,745,472 | 7/1973 | Garth | 328/63 |
| 3,921,079 | 11/1975 | Heffner et al. | 307/269 |
| 4,122,404 | 10/1978 | Fuhrman | 328/155 |
| 4,185,245 | 1/1980 | Fellinger et al. | 307/269 |
| 4,337,433 | 6/1982 | Yoshimura | 328/55 |
| 4,560,939 | 12/1985 | Dekarske et al. | 328/155 |
| 4,661,721 | 4/1987 | Ushiku | 307/269 |
| 4,686,482 | 8/1987 | Zoetman et al. | 307/269 |
| 4,691,124 | 9/1987 | Lodzius et al. | 307/269 |
| 4,757,264 | 7/1988 | Lee et al. | 307/269 |

FOREIGN PATENT DOCUMENTS

| | | | |
|---|---|---|---|
| 23631 | 2/1984 | Japan | |
| 0174016 | 10/1984 | Japan | 307/269 |
| 0075167 | 4/1985 | Japan | 307/269 |

OTHER PUBLICATIONS

ECL Data Book, Fairchild Semiconductor, pp. 9-19*.

Primary Examiner—John S. Heyman
Assistant Examiner—Tai V. Duong
Attorney, Agent, or Firm—Fay, Sharpe, Beall, Fagan, Minnich & McKee

[57] ABSTRACT

A system for feeding clock signals to a plurality of load units comprises an oscillator for generating a first clock signal having a predetermined frequency, a plurality of signal lines for transmitting a signal representative of the first clock signal to a plurality of load units, and delays assigned to the plurality of signal lines for adjusting phases of the signal transmitted on a corresponding line at connection points between the oscillator and the load unit. Each load unit is responsive to the signal transmitted on a corresponding signal line for producing second clock signals with a frequency n times greater than that of the second clock signals where n is an integer greater than one. Each load unit further is responsive to the second clock signal for generating a plurality of third clock signals which have discrete phases. The plurality of load units are synchronized with at least one of the plurality of third clock signals.

9 Claims, 4 Drawing Sheets

SYSTEM FOR FEEDING CLOCK SIGNALS

BACKGROUND OF THE INVENTION

The present invention relates to a clock feeding system for a plurality of load units which belong to an electronic apparatus such as an electronic computer that carry out the control operation in synchronism with clock signals, and particularly to a clock feeding system which is capable of easily distributing the clock signals.

An electronic apparatus such as an electronic computer includes a plurality of load units each of which is operated by clock signals having discrete phases. Each clock signal that is fed to a load unit is synchronized with the other clock signals, because each load unit has to perform a preassigned function in a synchronized manner with the other load units.

According to a typical conventional clock feeding system for feeding clock signals to load units in an electronic apparatus, as disclosed by Japanese Patent Laid Open No. 23631/1984, clock signals of n phases are formed at one place in the system in a concentrated manner, and the clock signals of n phases are proliferated into signals of a number necessary for the plurality of load units. The load units can then be operated in synchronism with each other by the same clock signal.

According to another conventional clock feeding system, signals of an oscillation waveform generated by an oscillator and a start signal for synchronism are supplied to a plurality of load units in an electronic apparatus, and each load unit produces clock signals of n phases which the unit itself requires and which are in synchronism with clock signals of other load units, thereby reducing the amount of hardware for transmitting the clock signals over the first system.

According to the first mentioned conventional system, the technology which forms clock signals was of n phases at one place in a concentrated manner is undesirable in that a large number of transmission lines for transmitting the clock signals to the plurality of load units and buffer gates is needed. The number of such transmission lines is equal to the number of signals necessary, which is generally equal to the number to meet all n phases. Moreover, since the load units are used in many number, the phase deviation tends to increase among the load units, and there has to be provided many phase-adjusting portions to correct the phase deviation, thereby also requiring an increased number of adjusting steps.

According to the second mentioned conventional system, oscillation signals of the oscillator have to be supplied to the load units with associated start signals. When the oscillation frequency of the oscillator is high, coaxial cables and connectors of a wide band have to be used to propagate the high-frequency signals.

Current computer technology needs require an improved clocking signal feeding system that overcomes these problems and others, to provide a clock feeding system that has a minimal number of clock signal transmission lines, that avoids the need for an associated start signal and which has the capability to provide a plurality of corresponding phase shifted signals to a first predetermined clock signal.

SUMMARY OF THE INVENTION

An object of the invention is to obviate the above mentioned disadvantages of the prior known systems. Another object of the invention is to reduce the number of parts necessary to feed clock signals to a plurality of load units. Another object of the invention is to reduce the number of phase-adjusting portions.

In accordance with the present invention, the system for feeding clock signals to a plurality of load units comprises an oscillator for oscillating a first clock signal having a predetermined frequency, a plurality of signal lines for transmitting a signal representative of the first clock signal to a plurality of load units, and delays assigned to the plurality of the signal lines for adjusting phases of the signal transmitted on corresponding lines at the connection points between the oscillator and the load units.

Each load unit comprises means responsive to the signal transmitted on the corresponding signal line for producing second clock signals with a frequency n times greater than that of the second clock signals where n is an integer greater than one.

Each load unit further comprises means responsive to the second clock signal for generating a plurality of third clock signals which have discrete phases. The plurality of load units are synchronized with at least one of the plurality of third clock signals. The clock feeding system is so constituted that only one line is needed for feeding clock signals to operate each load unit in synchronism with others.

BRIEF DESCRIPTION OF THE DRAWINGS

The invention may take physical form in certain parts and arrangements of parts which will be described in detail in this specification and illustrated in the accompanying drawings which form a part hereof and wherein.

DESCRIPTION OF THE PREFERRED EMBODIMENT

Figure 1:
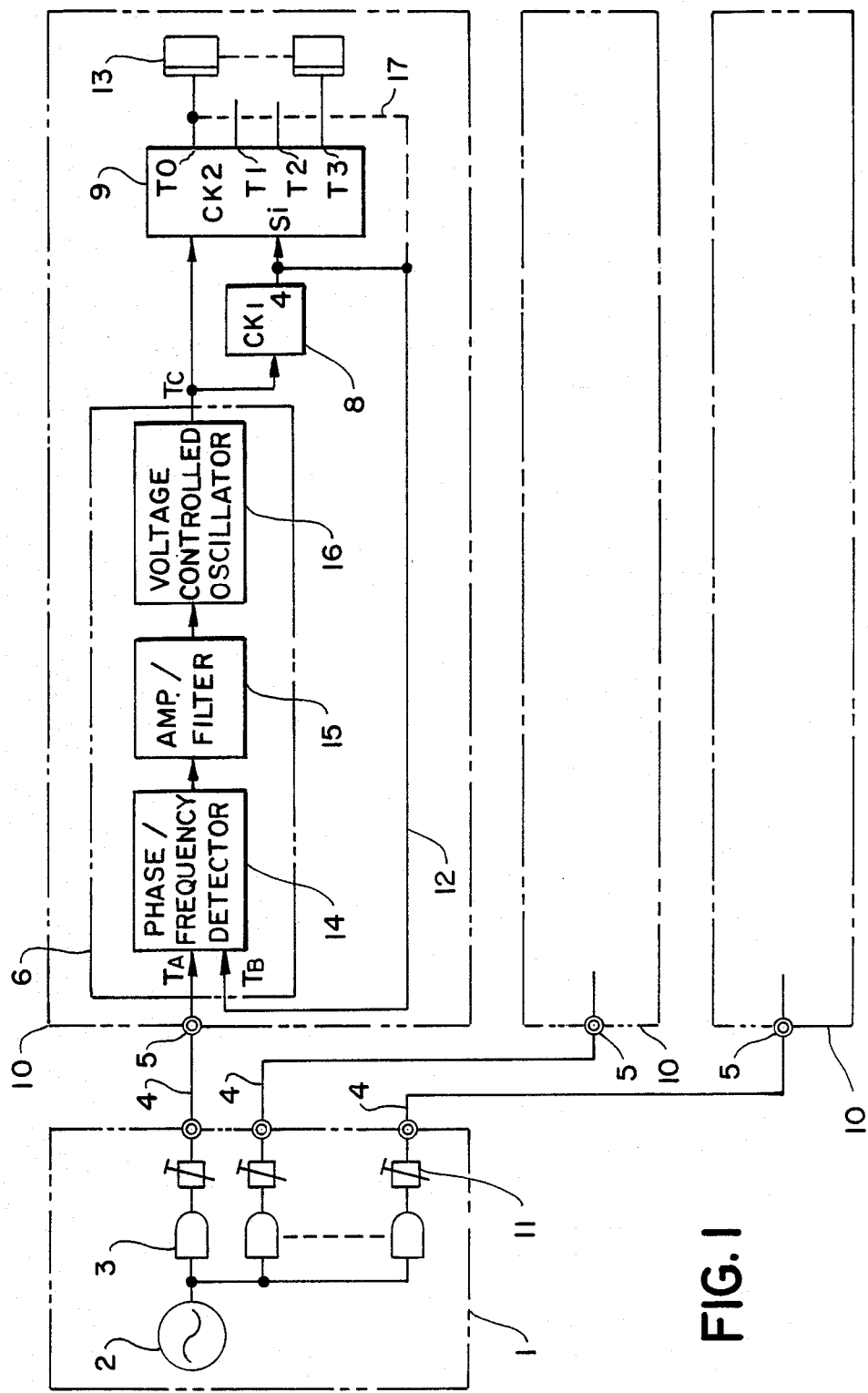
FIG. 1 is a diagram of a clock feeding system according to an embodiment of the present invention.

A system for feeding clock signals in accordance with the subject invention is illustrated in FIG. 1 and commprises a reference clock generating unit 1, a plurality of signal lines 4 such as coaxial cables, and a plurality of load units 10.

The reference clock generating unit 1 comprises an oscillator 2 for generating a first clock signal having a predetermined frequency, a plurality of buffer gates 3 for buffering the output of the oscillator and distributing the first clock signal, and a plurality of delays 11 each assigned to a corresponding one of the plurality of signal lines 4 for adjusting phases of the oscillator signal transmitted on a plurality of the corresponding signal lines to the load units 10. The reason for the delays is that the length of the signal lines 4 to the load units are different so that the phases of signals on the lines 4 are different from each other at the load unit connectors 5. The delays amend the differences.

The load unit 10 comprises a producing unit 6 responsive to the signal on the signal line 4 for producing a second clock signal with a frequency n times greater than that of the first clock signal, where n is an integer greater than one. In this embodiment n is four, but it is intended that it could be other numbers as well. The load unit also includes a frequency-dividing unit 8 responsive to the second clock signal for supplying a feed back signal 12 having a frequency which is n times less than that of the second clock signal, a clock generating unit 9 such as a shift register responsive to the second signal for generating a plurality of third clock signals, T0, T1, T2 and T3, each of which has a discrete phase, and flip-flop circuits 13 responsive to the third clock signals for setting data from a logic circuit (not shown).

The load units 10 perform predetermined functions. The flip-flop circuits 13 are formed stages which construct the functions.

The producing unit 6 comprises a phase/frequency detector 14, an AMP/filter 15, and a voltage controlled oscillator 16.

The phase/frequency detector 14 compares the signal transmitted on signal line 4 and the feedback signal on signal line 12 representing phase with respect to the second clock signal, and provides a differential voltage signal as a result of the comparison. The voltage controlled oscillator 16 responds to the differential signal through the AMP/filter 15 for increasing or decreasing frequency thereof. The detector 14, filter 15, oscillator 16, and unit 8 are connected together through a closed loop as described in "ECL DATA BOOK" published by Fairchild Co., pp. 9-19. The circuit so operates that the phase is in agreement between frequency $f_A$ of the first signals which inputs to the detector 14 and frequency $f_C/n$ of the feedback signal obtained by oscillator 16. (Note $T_A$, $T_B$, and $T_C$ of FIG. 2, $f_A = f_B = f_C/n$.)

The second clock signals are input to the shift register 9 and the shift of the shift register is controlled by the feedback signals having a frequency n times greater than that of the second clock signals. The shift register includes n bit stages which are serially connected with each other and the third clock signal. T0-T3 are output in parallel from the stages. Clock signals having a total of n phases ranging from zero phase to n−1 phase can be obtained from the outputs of the n-bit shift register 9, because the dividing unit 8 has a frequency-dividing ratio 1/n. The producing unit 6 so works that the frequency of the feedback signals is in agreement with the frequency of the first signals generated from the reference clock generating unit 1. The output signal of the unit 8 is also input to the shift register 9 of n bits, and the output of the voltage controlled oscillator 16 is used as a shift signal of the shift register 9.

With continued reference to FIG. 1, the first signals generated by the oscillator 2 in the reference clock generating unit 1 having a frequency $f_A$ (FIG. 2) which is the same as that of the clock signals required by the load units 10. The first signals are proliferated through a plurality of buffer gates 3 so as to correspond to each of the load units 10, and are applied to input terminals TA in the load units 10 via delay elements 11 that adjust the phase depending on the length of the cables 4. Each signal corresponds to a particular load unit 10. The output signal from the output terminal TC of the producing unit 6 is applied to the input terminal CK1 of the frequency-dividing circuit 8 and to the clock input terminal CK2 of the shift register 9. The output of the frequency-dividing circuit 8 is applied to the shift-in input terminal Si of the shift register 9 and to the input terminal TB via the feedback line 12. The shift register 9 is of the serial-in/parallel-out type. Signals input to the shift-in input terminal Si are shifted in synchronism with signals input to the clock input terminal CK2, and a plurality of signals having dissimilar phase are produced onto the output terminals T0 to T3. Output of the output terminals T0 to T3 are used as clock signals for the flip-flop circuits 13 to serve as loads.

Input terminals TA and TB of producing unit 6 receive inputs to the phase/frequency detector 14 and the output terminal TC produces the output of the voltage controlled oscillator 16 that is controlled by the detector 14. The output signals of the output terminal TC are divided for its frequency into ¼ by the frequency-dividing circuit 8, and are fed back to the input terminal TB of the detector 14.

Figure 2:
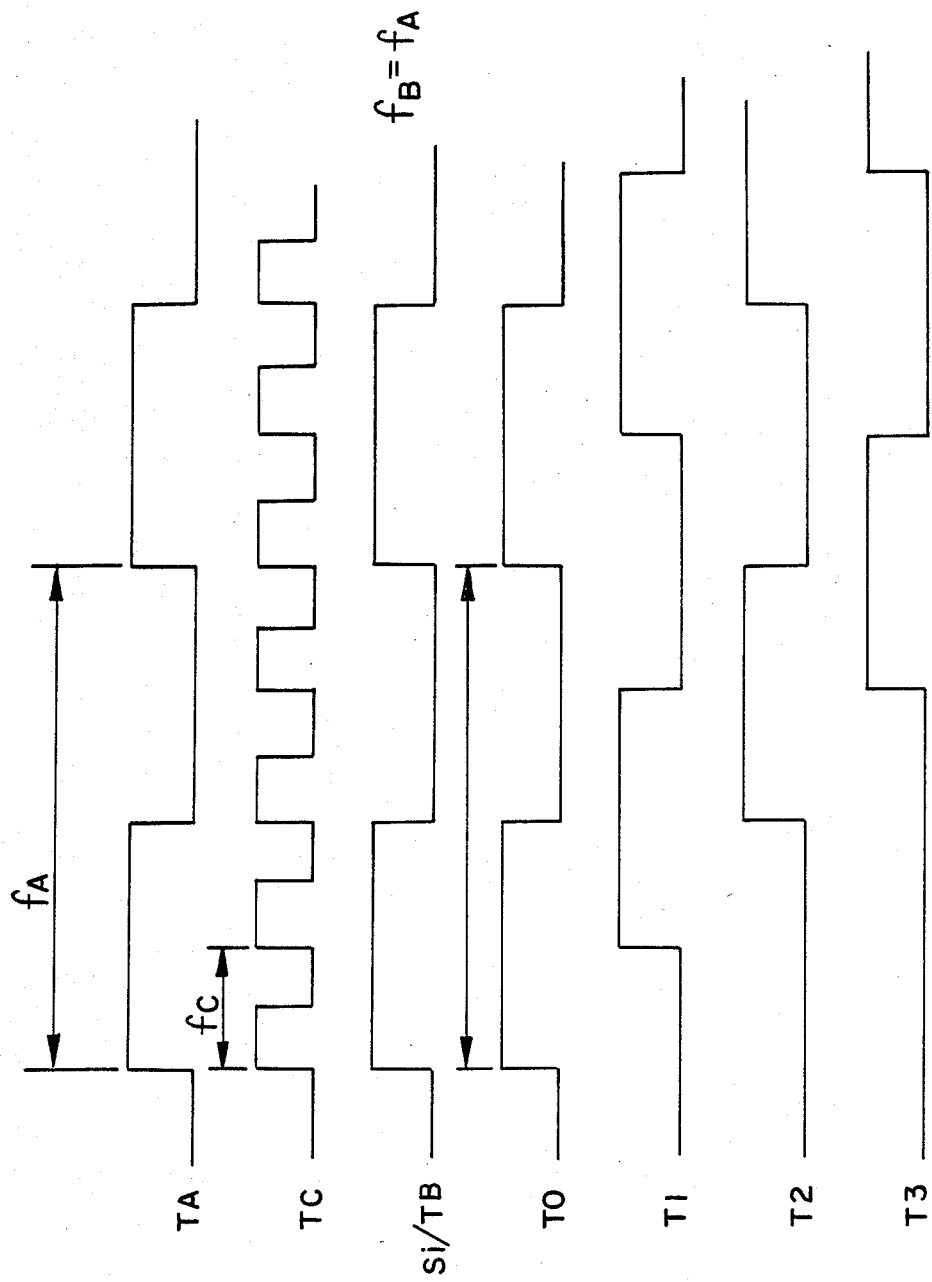
FIG. 2 is a diagram of signal waveforms for illustrating the operation.

With reference to FIG. 2, the various frequency relationships of the above clock signals are illustrated. The following relationships, i.e., $f_C = 4 \times f_A$ and $f_A = f_B$, are maintained among the frequency fC of output signals from the terminal TC and the frequencies fA and fB of input signals to the terminals TA and TB, owing to the operation principle of a PLL (phased locked loop) circuit. The PLL circuit constituted by a loop circuit of the frequency-dividing circuit 8, the phase/frequency detector 14, low-pass filter 15 and voltage controlled oscillator, so operates that the phase is in agreement with the frequency of the input signals input to the input terminals TA and TB. That is, there are obtained at the terminal TC the output signals having a frequency four times ($f_c$) as great as the frequency ($f_A$) of the first clock signals generated by the oscillator 2 in the reference clock generating unit 1. Furthermore, since the PLL circuit so operates that the input signals input to the terminals TA and TB will have phases that are in agreement with each other, the shift register 9 in the clock generating unit 6 in each load unit 10 produces from its output terminals T0 to T3 the clock signals of each of the phases in synchronism with each of the phases of the clock signals among the plurality of load units.

In the above mentioned embodiment, the clock forming unit in the load unit forms clock signals of n phases. When the clock signals of n phases that are required by the load units are to be formed, in general, the frequency-dividing ratio of the frequency-dividing circuit 8 is set to 1/n, and the shift register 9 of n bits is employed to form the clock signals of n phases.

According to the above-mentioned embodiment, the load units form clock signals of n phases that are in synchronism with those of other load units by simply transmitting one type of reference signal from the reference clock generating unit to a plurality of load units, thereby making it possible to reduce the amount of hardware that is required for supplying clock signals, and reducing the cost and the required area in an assembly. Further, since the clock signals of n phases are formed on the load side, variance in the quality of parts causes the phase to deviate little among the clock signals of n phases while they are being transmitted, and the load units exhibit improved performance.

In the above-mentioned embodiment, furthermore, the output signals of the frequency-dividing circuit 8 are fed to the input terminal TB (FIG. 1). However, alternatively the output signal from the output terminal T0 of the shift register 9 which has a frequency and phase the same as that of the output of the frequency-dividing circuit 8, may be fed back to the input terminal TB of the shift register 9 (note dashed line 17 of FIG. 1). In this case, the PLL circuit works to automatically correct delays of shift registers 9 in the load units 10, so that the phase deviates little among the clock signals of the load units 10. Therefore, the delay elements 11 having a reduced width of adjustment can be employed for the reference clock generating unit 1 to adjust the phase deviation among the load units 10.

Figure 3:
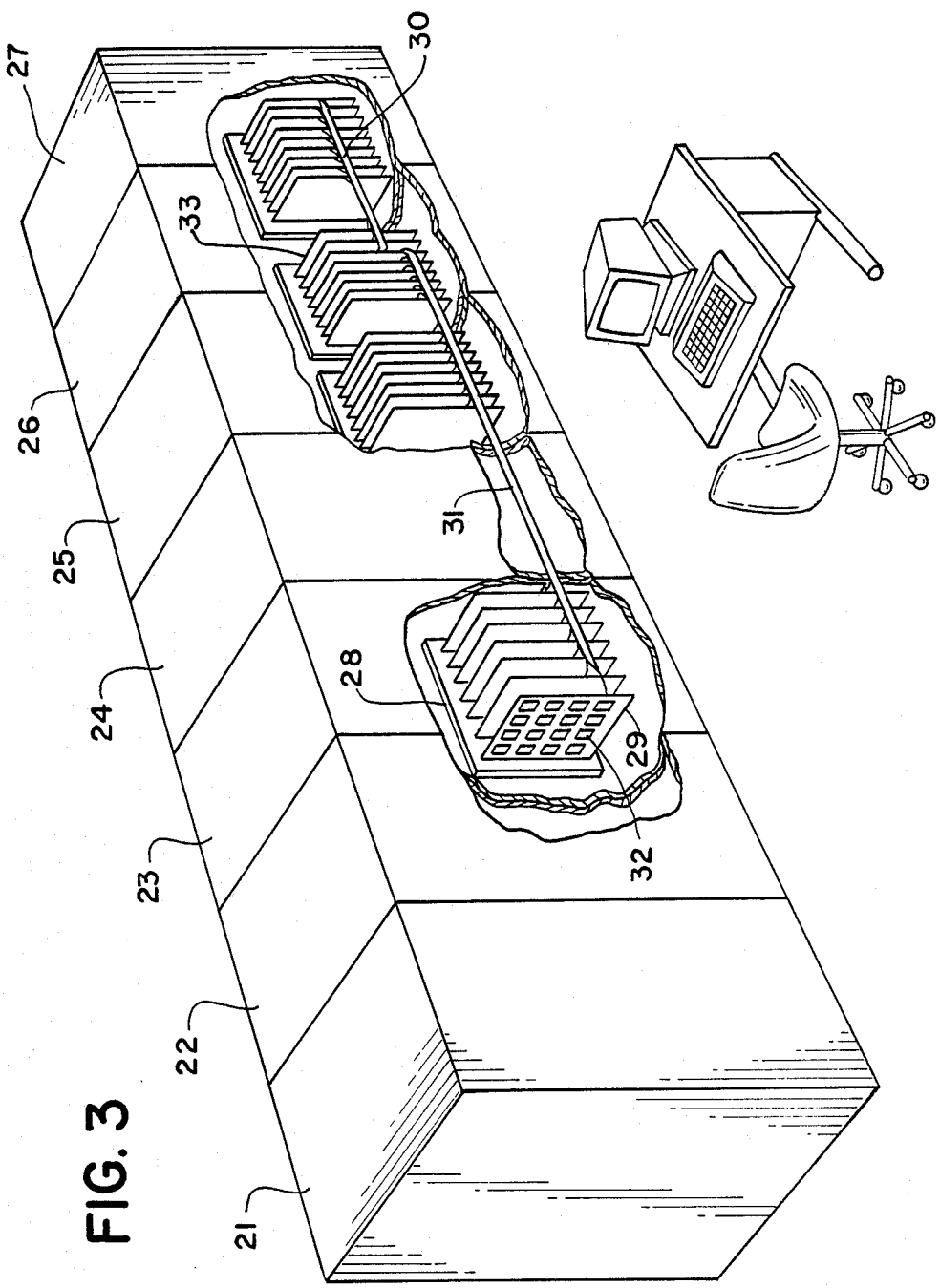
FIG. 3 is a diagram of a computer which is applied to the present invention; and, FIG. 4 is a diagram of a clock feeding system according to another embodiment of the present invention.

FIG. 3 illustrates a computer which incorporates an embodiment of the subject invention. The computer comprises many computer components such as I/O processor 21 and 22, main stage 23, service processor 24, instruction processor 25 and 27, and memory controller 26. Each component has at least one mother board 28 mounted thereon. The mother board 28 has a plurality of circuit boards 29 on which a plurality of integrated circuits 32 are mounted.

The integrated circuits are operated in a synchronized manner with each other to perform a function assigned thereto.

In the computer, the embodiment is applied as follows.

The reference clock generating unit 1 is disposed on the circuit board 33 of the memory controller 26. The load units 10 correspond to the integrated circuit 32 of a component. The signal lines 4 are involved in the cable 30, 31 and go through on the circuit board 29 and reach the integrated circuits 32 as load units.

Figure 4:
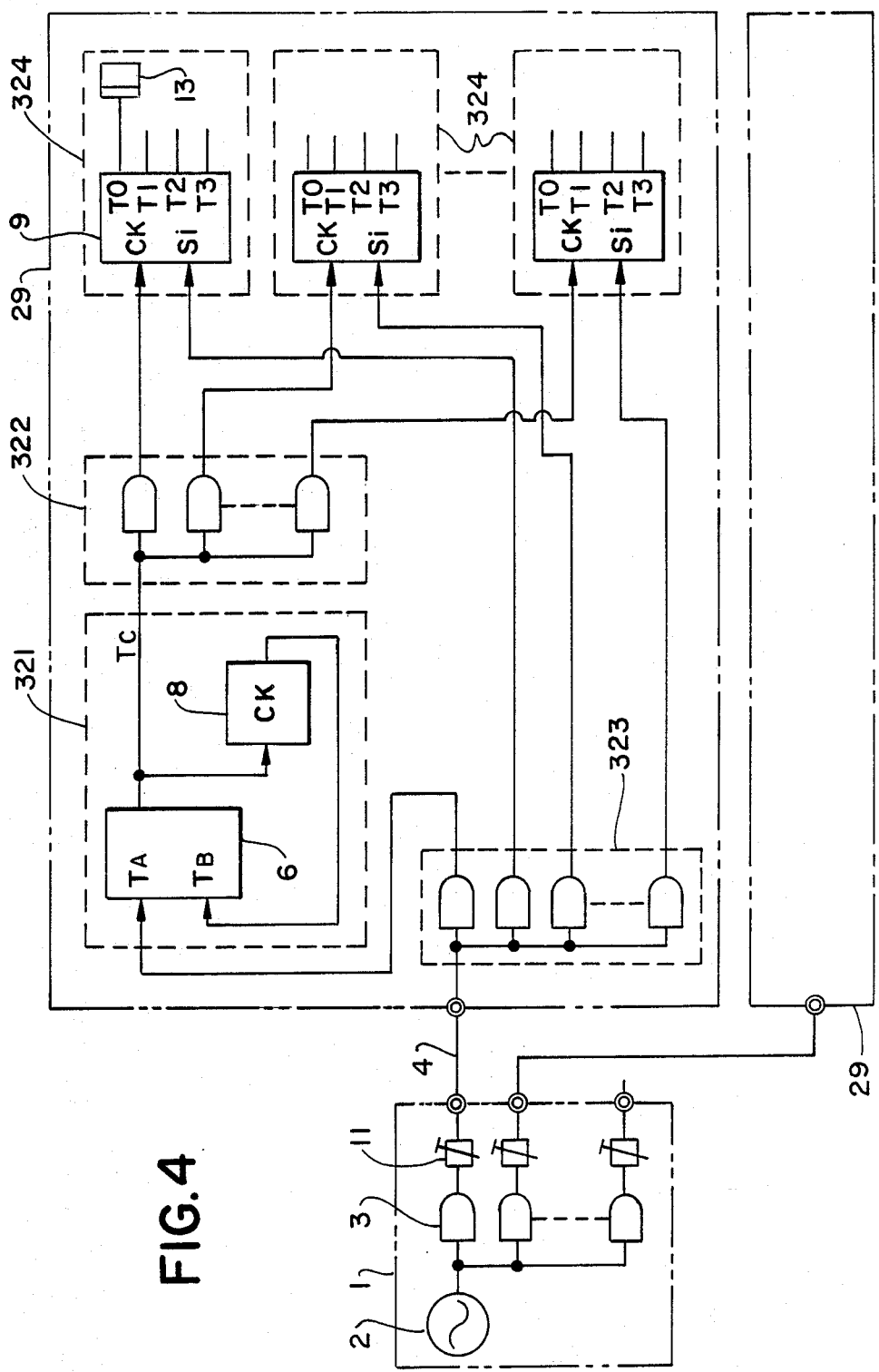

Another embodiment of the invention will now be described in conjunction with FIG. 4. This embodiment deals with the case where the load units 10 correspond to the circuit board 29. In FIG. 4, the elements designated by the same number as elements in FIG. 1 are the same.

A signal from a reference signal generating unit 1, which includes an oscillator 2 and buffer gates 3, is sent to a plurality of circuit boards 29 via delays 11 and signal lines 4. The first clock signal to be received by the circuit board 29 is proliferated through a buffer gate IC 323 by the number of LSI's 324 in the circuit board plus one, and is input to an Si input of a shift register 9 of each of the LSI's and to an input TA of the producing unit 6 in an IC 321. The output of the 321 is input to a buffer gate IC 322.

A frequency signal that is multiplied into four times the frequency of the signals input to the input terminal TA of the IC 321 is produced from the output terminal TC and is proliferated through the buffer gate IC 322 by a number of LSI's 324 and is connected to an input CK of the shift register 9 in each of the LSI's 324.

As explained above, the flip-flop circuit 13 set data from logical circuit (not shown) in response to the clock signals T0, T1, T2, or T3 so that the IC 324 can perform predetermined functions.

According to the embodiment, the number of signal lines 4 can be reduced over prior art systems.

According to the present invention as described above, the load units form clock signals of n phases that are in synchronism with those of other units by simply transmitting reference signals of one type from the reference clock generating unit to a plurality of load units. It is therefore made possible to reduce the amount of hardware, cost, required area, and the number of steps for adjusting the phase.

Furthermore, use of the PLL circuit makes it possible to reduce the frequency of reference signals transmitted to the load units. Therefore, there is no need of using expensive parts having a wide band for transmitting reference signals to the load units, presenting advantage in economy. Moreover, clock signals of n phases are formed on the load side, making it possible to reduce the phase deviation among the clock signals and to improve performance of the load units.

We claim:

1. A system for feeding a clock signal to a plurality of computer components, each of which executes a function assigned thereto in synchronization with the clock signal, comprising:
    a first computer component means including means for generating a first clock signal and having delay means for selectively adjusting phases of the signals at connection points to a secondary computer component; and,
    a plurality of the secondary computer components including a circuit board which has a plurality of integrated circuits wherein each integrated circuit has: means responsive to the first clock signal for producing a second clock signal with a frequency n times greater than that of the first clock signal, wherein n is an integer greater than one, means responsive to the second clock signal for generating a plurality of third clock signals which have discrete phases in relation to each other whereby the performance of a synchronized function in relation to the plurality of clock signals is enabled, and a means for performing a part of the function assigned to the computer component.

2. The system of claim 1 wherein the secondary computer components include a circuit board which has a plurality of integrated circuits wherein at least one of the integrated circuits has the producing means and the generating means.

3. The system of claim 2, wherein the circuit board further has means for transmitting a signal representative of the third signals to an other integrated circuit and the other integrated circuit has the producing means.

4. The system of claim 1 wherein the producing means has a means for comparison between the first signal and a feedback signal representing phase with respect to the second clock signal for generating a differential signal and means responsive to the differential signal for selectively adjusting frequency of the second clock signal.

5. The system of claim 1, wherein the producing means has means for comparing the first signal and a feedback clock signal having a different frequency than that of the second clock signal for generating a differential signal and means responsive to the differential signal for selectively varying frequency of the second clock signal.

6. The system of claim 1 wherein the producing means further has means for dividing the first signal into the feedback signal to supply the comparing means to the feedback clock signal.

7. A method of feeding clock signals to a plurality of associated computer components, each of which executes an assigned function in synchronization with the clock signal, comprising the steps of:
    generating a first clock signal remote from the associated computer components;
    transmitting a signal representative of the first clock signal via a single line to the plurality of computer components, respectively, each component including a load unit having a producing unit for producing a second clock signal;
    generating the second clock signal at the producing unit with a frequency n times greater than that of the signal representative of the first clock signal in response to the signal wherein n is an integer greater than one;

generating a plurality of third clock signals at the load unit, which have a different phase from each other, in response to the second clock signal;

supplying the third clock signal to the associated computer components whereby they execute the function assigned thereto in accordance therewith.

8. The method of claim 7, wherein said second clock signal generating step includes the steps of comparing the signal representative of the first clock signal and a feedback clock signal, which frequency is n times smaller than that of the second clock signal, so as to generate a differential signal; and adjusting the frequency of the second clock signal in response to the differential signal.

9. A system for feeding clock signals to a plurality of load units comprising:

an oscillator for generating a first clock signal having a predetermined frequency;

means for transmitting the first signal to a plurality of load units;

phase adjustment means for adjusting a phase of the first signal transmitted on the transmitting means to compensate for varied lengths of the transmitting means;

a plurality of load units each having a means responsive to the first signal for producing a second clock signal with a frequency n times greater than that of the first clock signal, where n is an integer greater than one, wherein the means for producing the second clock signal include: means for comparing the first signal and a feedback clock signal having a frequency different from the second clock signal, means for providing a differential signal as a result of the comparison, means responsive to the differential signal for selectively adjusting the frequency of the second clock signal, and means responsive to the second clock signal for supplying the feedback clock signal to the comparing means; and, the load unit further having means responsive to the second clock signal for generating a third clock signal having a phase discrete from the first clock signal, including a shift register having a plurality of stages serially connected to each other, from which the third clock signals are outputted in parallel, whereby the plurality of load units are synchronized with the third clock signal.

* * * * *